United States Patent

[11] 3,593,193

[72] Inventors Kern Ko-Nan Chang
Princeton;
Shing-Gong Liu, Princeton; John Joseph
Risko, Cranbury, all of, N.J.
[21] Appl. No. 834,805
[22] Filed June 19, 1969
[45] Patented July 13, 1971
[73] Assignee RCA Corporation

[54] HIGH POWER AVALANCHE DIODE MICROWAVE OSCILLATORS HAVING OUTPUT FREQUENCY ABOVE DIODE TRANSIT TIME FREQUENCY
11 Claims, 4 Drawing Figs.

[52] U.S. Cl. .......... 331/96, 331/107 R
[51] Int. Cl. .......... H03b 7/14
[50] Field of Search .......... 331/96, 97, 107

[56] References Cited
UNITED STATES PATENTS 3,300,729 1/1967 Chang .......... 331/96 X
3,510,800 5/1970 Kaneko et al 331/96

OTHER REFERENCES

Dalman, " A Coupled-Cavity Avalanche Diode X-Band Oscillator," THE MICROWAVE JOURNAL , March 1968, pp. 32, 34, 149 (331-107)

*Primary Examiner*—Roy Lake
*Assistant Examiner*—Siegfried H. Grimm
*Attorney*—Edward J. Norton

ABSTRACT: A wave tuning structure including a first portion in cooperative relationship with an anomalous silicon avalanche diode, a second portion coupled to the first portion for supporting oscillations at the transit time frequency of the diode, and a third portion coupled to at least one of the first and second portions for supporting oscillations at a given frequency significantly higher than the transit time frequency, serves to provide relatively high power at the given frequency to a load coupled to the third portion of the wave tuning structure, such as 17 watts at 24 gigahertz and 28 watts at 10.5 gigahertz for instance, in response to a bias pulse being applied to the diode. A significant output power is still obtained at frequencies exceeding 33 gigahertz.

INVENTORS
Shing-Gong Liu,
John J. Risko and
Kern K. N. Chang,
BY George J. Seligsohn
ATTORNEY INVENTORS
Shing-Gong Liu,
John J. Risko and
Kern K. N. Chang.
BY George J. Seligsohn
ATTORNEY

HIGH POWER AVALANCHE DIODE MICROWAVE OSCILLATORS HAVING OUTPUT FREQUENCY ABOVE DIODE TRANSIT TIME FREQUENCY

The invention herein described was made in the course of or under a contract or subcontract thereunder with the Department of the Air Force.

This invention relates to microwave oscillators and, more particularly, to such oscillators employing avalanche diodes.

As is known, an avalanche diode operating at its characteristic transit time frequency may be employed as the amplifying element in a microwave oscillator. Depending upon the dimensions and doping of the diode, the transit time frequency of the diode is normally somewhere in the C or X microwave bands. More recently, it has been shown (H. J. Prager, K. K. N. Chang, and S. Weisbrod, "High Power, High Efficiency Silicon Avalanche Diodes at Ultra High Frequencies," *Proceedings of the IEEE*, Apr., 1967, pp 586—587) that certain avalanche diodes, operating in a so-called anomalous mode, are capable of generating high powers (up to hundreds of watts) at a frequency in the UHF or L-band, which is much below the transit time frequency of the diode. Reference is also made to the article, "Why high efficiency at avalanche subharmonics?" appearing on page 14 of the Apr., 1969 issue of *Microwaves*, published by Hayden Microwaves Corporation, which discusses this high-power, high-efficiency operation of an anomalous avalanche diode at a frequency which is much below its transit time frequency.

It has now been found that it is possible to operate an avalanche diode in its anomalous mode at a frequency in the X-band, K-band, or Ka-band, which operating frequency is significantly higher than its transit time frequency. The term "anomalous," as used herein refers to the fact that the avalanche diode has a structure determined by its dimensions and doping which make it capable of supporting oscillations at relatively high power at a frequency which is significantly different from its normal transit-time mode oscillation frequency. Some features which seem to differentiate anomalous mode oscillations from normal transit-time mode oscillations are: (1) a significant decrease in average voltage observed across the diode during oscillation at its peak power output; (2) the threshold current-density corresponding to this high-power oscillation is high, typically at least 2000 amperes per square centimeter, and (3) the fact that both high and low frequency tuning are critical to achieve high power output at a frequency significantly above the transit-time mode oscillation.

It is therefore an object of the present invention to operate an anomalous avalanche diode at a frequency significantly higher than its transit-time frequency.

Briefly, in accordance with the present invention, a wave tuning structure includes a first portion in cooperative relationship with an anomalous avalanche diode. A second portion of the wave tuning structure, which is coupled to the first portion thereof, supports oscillations at a transit-time frequency of the diode. A third portion of the wave tuning structure, which is coupled to at least one of the first and second portions thereof, supports oscillations at a given frequency significantly higher than the transit-time frequency. Such a combination, in response to a power consuming load being coupled to the third portion and a bias level of a given value being applied to the diode, develops high power oscillations at the given frequency which are applied to the load.

This and other objects, features and advantages of the present invention will become more apparent from the following detailed description taken together with the accompanying drawing, in which.

Figure 1:
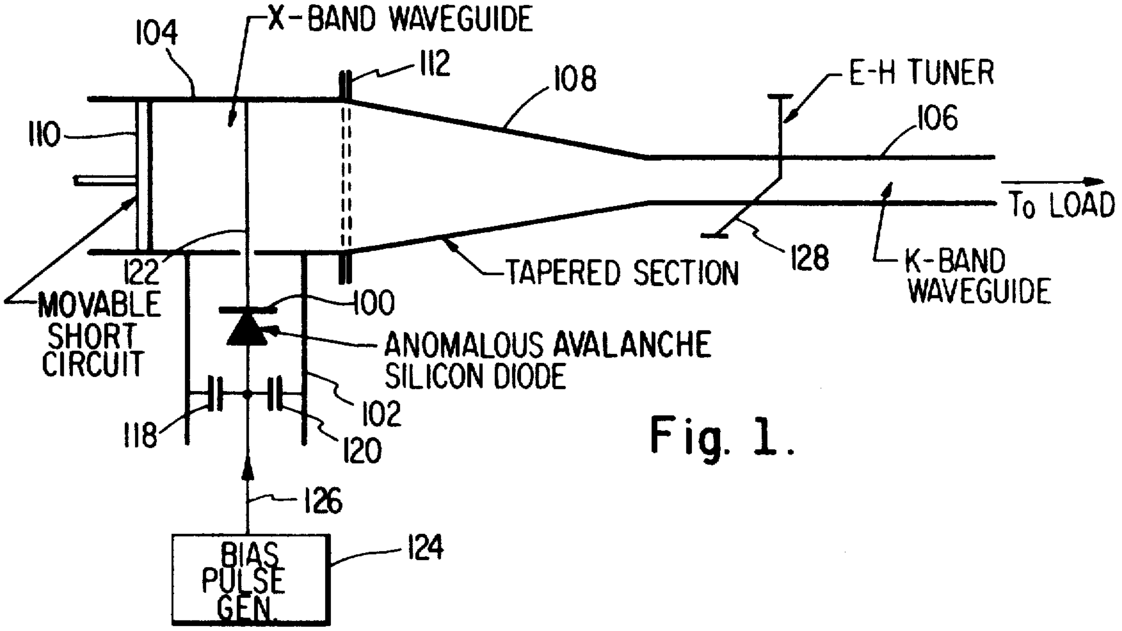
FIG. 1 illustrates in diagrammatic form a first embodiment of the present invention.

Referring now to FIG. 1, anomalous avalanche silicon diode 100 is located within a cavity 102 comprising the first portion of a wave tuning structure. An X-band waveguide 104 comprises the second portion of the wave tuning structure and K-band waveguide 106 comprises the third portion of the wave tuning structure. K-band waveguide 106 has a tapered section 108 extending therefrom for coupling waveguide 106 to X-band waveguide 104 by means of flange 112. The left end of X-band waveguide 104 is terminated by movable short circuit 110. A power consuming load, not shown, terminates the right end of K-band waveguide 106. E-H tuner 128 serves to provide proper matching for the load. E-H tuner 128 includes first and second perpendicular independently movable screws or posts inserted within waveguide 106 through the walls thereof. The first of these screws or posts is oriented to be parallel to the electric field of any electromagnetic energy within waveguide 106, while the second of these screws or posts is oriented to be parallel to the magnetic field of any electromagnetic energy within waveguide 106.

Bias pulse generator 124 provides a predetermined bias level during each pulse which has a relatively short duty cycle, such as one percent or so. These bias pulses are applied as a bias voltage across diode 100 within cavity 102 over conductor 126. Cavity 102 is coupled to X-band waveguide 104 by probe 122. RF bypass capacitances 118 and 120 prevent microwave energy from reaching bias pulse generator 124.

Anomalous avalanche silicon diode 100, by way of example, may be a mesa $P^+NN^+$ structure and have an N region which is an epi-layer of 3 microns thick which has a resistivity of 5 ohm-centimeters. The diameter of the mesa structure may be 20 mils. The breakdown voltage of the diode may be in the order of 50 volts. The typical operating DC current density is in the order of 5,000 amperes/cm.$^2$. Alternatively, the diode may have an $N^+PP^+$ structure.

Although in FIG. 1 second portion 104 of the wave tuning structure is shown as an X-band waveguide and third portion 106 of the wave tuning structure is shown as a K-band waveguide, second portion 104 may be a C-band waveguide, in which case the transit-time frequency of diode 100 is in the C-band, and third portion 106 may be an X-band waveguide. In another arrangement, second portion 104 may be an X-band waveguide and third portion 106 may be a Ka-band waveguide.

The important fact is that wave tuning structure portion 104 is dimensioned to be able to support the transit-time frequency of the diode, while wave tuning structure portion 106 is dimensioned to be able to support the frequency applied to the load, which is significantly higher than the transit time frequency, but not to be able to support the transit-time frequency itself, i.e., the cutoff frequency of waveguide 106 is below the transit-time frequency of the avalanche diode.

In operation, movable short circuit 110 and E-H tuner 128 are adjusted to control the frequency of the electromagnetic energy applied to the load and to maximize the power of this electromagnetic energy applied to the load. Typical of the power outputs obtainable at various frequencies with a combination of structure of the type shown in FIG. 1 are the following: A power of 12.5 watts at a frequency of 11.5 GHz.; a power of 6.5 watts at a frequency of 23 GHz.; a power of 1.5 watts at a frequency of 26 GHz; and a power of 0.4 watts at a frequency of 33.2 GHz.

Figure 2:
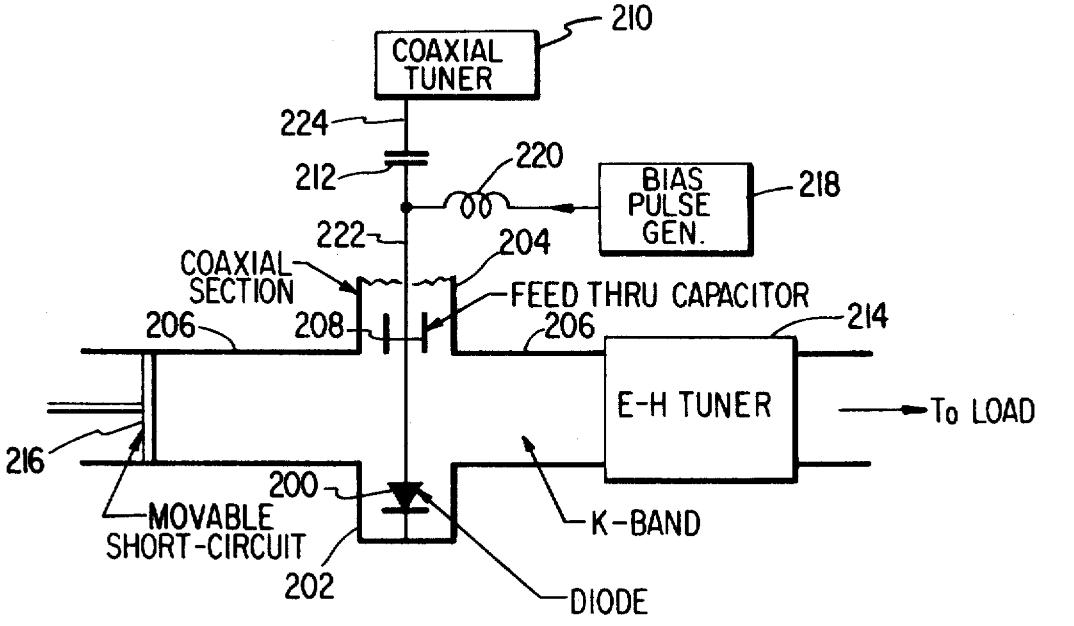
FIG. 2 illustrates in diagrammatic form a second embodiment of the present invention.

Referring to FIG. 2, there is shown a second embodiment of the invention. In FIG. 2, cavity 202, in which anomalous avalanche silicon diode 200 is located, is coupled directly to K-band waveguide 206 intermediate the ends thereof. The left end of waveguide 206 is terminated in movable short circuit 216 and the right end of waveguide 206 is coupled to a power consuming load, not shown. E–H tuner 214 is located, as shown, in cooperative relationship with waveguide 206 intermediate the point thereof at which cavity 202 is located and the right end thereof which is coupled to the load. FIG. 2 does not employ an X-band waveguide, as is the case in FIG. 1, but, instead, utilizes a coaxial section which is joined to K-band waveguide 206 by a T-junction and is coupled thereto by feedthrough capacitor 208. For the sake of clarity, only a portion of the outer conductor of coaxial section 204 is shown. However, the center conductor of coaxial section 204 consists of first portion 222 and second portion 224 which are coupled to each other by a DC blocking capacitance 212. Coaxial inner conductor portion 222, which extends across K-band waveguide 206 into cavity 202, is connected directly to diode 200 and is utilized both to apply a bias pulse to diode 200 from bias pulse generator 218 through inductance 220 and to couple RF energy between cavity 202 and waveguide 206. Inductance 220 serves the purpose of preventing microwave energy from reaching bias pulse generator 218. The distal end of coaxial section 204 is terminated by a coaxial tuner 210. Tuner 210 may be a movable short circuit in its most simple case or, in a more complex case, may include other coaxial tuning elements, such as stub tuners, line stretchers or other such elements. In fact, although not shown, coaxial tuner 210 may include a second power-consuming load and appropriate tuning means for extracting energy at a microwave frequency in the UHF or L-band, which is significantly lower than the transit-time frequency, in the manner suggested by the prior art, discussed above.

The embodiment of FIG. 2, when employing an anomalous avalanche silicon diode having the parameters discussed above in connection with FIG. , is capable if operated at a current density of about 8,000 amperes/cm.$^2$ in producing a pulsed power of 17 watts at 24 gigahertz, and 28 watts at 10.5 gigahertz.

In operation, movable short circuit 216, coaxial tuner 210 and E–H tuner 214 are adjusted to provide maximum power to the load at a particular frequency.

Figure 3A:
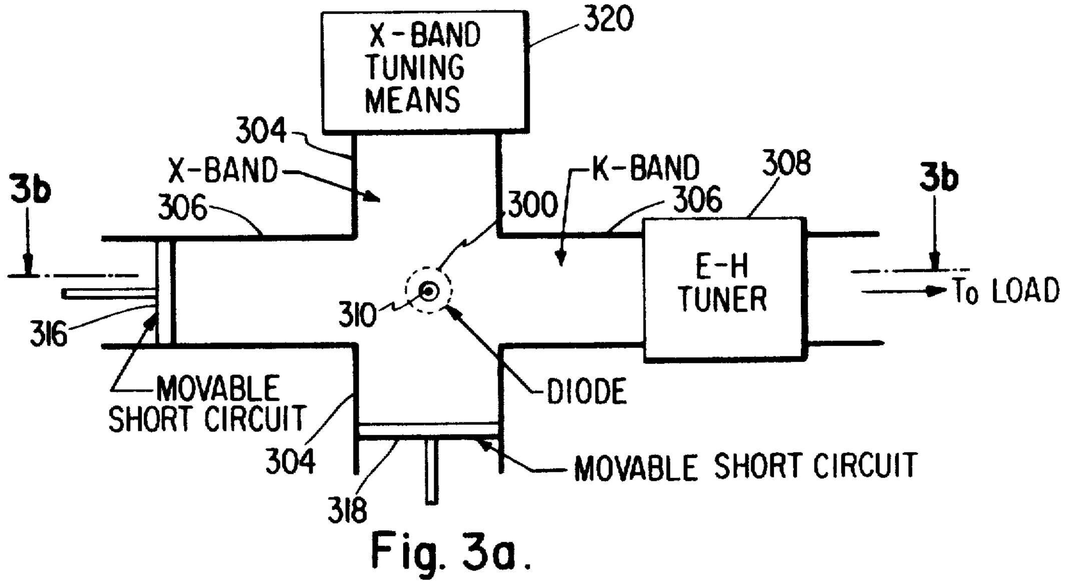
FIG. 3*a* and 3*b* illustrate in diagrammatic form a third embodiment of the present invention.
Figure 3B:
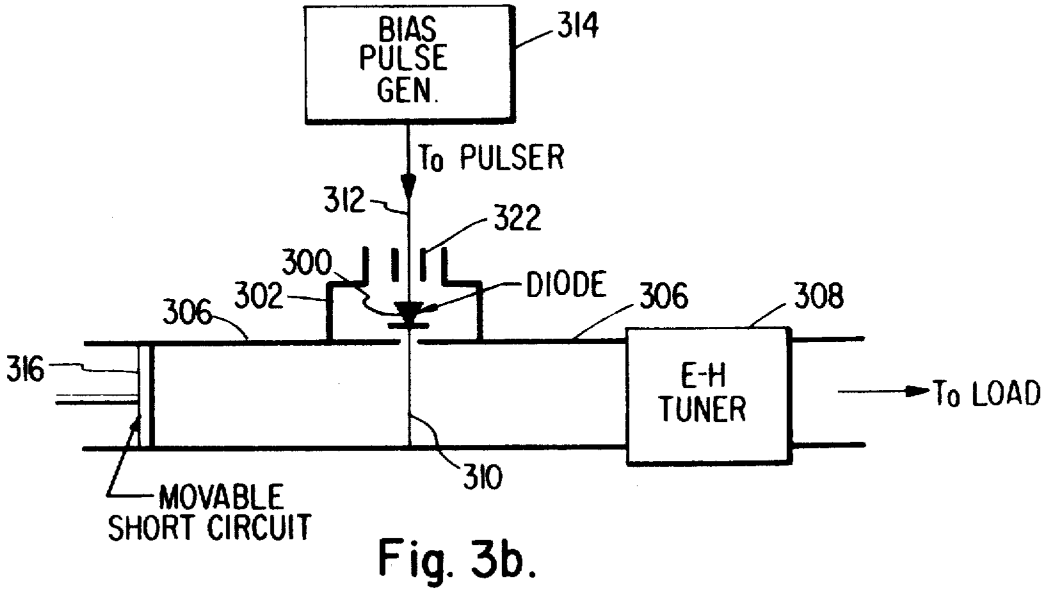

FIGS. 3*a* and 3*b* show respectively a top view and a side view of a third embodiment of the present invention. As shown in FIG. 3*a*, K-band waveguide 306 and X-band waveguide 304 are oriented perpendicular to each other and intersect each other intermediate the ends thereof to form a cross. This cross defines a central interior region which is common to the two waveguides. A movable short circuit 316 terminates the left end of K-band waveguide 306, while the right end of K-band waveguide 306 is coupled to a power-consuming load, not shown. Intermediate the common central region and the right end of K-band waveguide 306 is E–H tuner 308. The lower end of X-band waveguide 304 is terminated in movable short circuit 318, while the upper end of X-band waveguide 304 is terminated in X-band tuning means, which may be simply another movable short circuit or which may include another E–H tuner as well as a terminating impedance. This terminating impedance may include a second load.

As shown in FIG. 3*b*, a cavity 300 is located outside of, but adjacent to, the central region defined by the intersecting waveguides 304 and 306. Cavity 300 extends in a direction substantially perpendicular to the plane defined by intersecting waveguides 304 and 306. Located within cavity 300 is anomalous avalanche silicon diode 300, which may have characteristics similar to those described above in connection with FIG. 1. A bias pulse from bias pulse generator 314 is applied through diode 300 over conductors 312 and 310. Conductor 310 which enters and is connected across a common central region of waveguides 304 and 306, further acts as means for coupling RF energy between cavity 302 and waveguides 304 and 306. Capacitance 322 bypasses RF energy and prevents it from reaching bias pulse generator 314.

Although in the embodiment shown in FIG. 2 and in the embodiment shown in FIGS. 3*a* and 3*b*, the transit time frequency is assumed to be in the X-band and the given high frequency applied to the load is assumed to be in the K-band, just as is the case described above in connection with FIG. 1, alternative frequency arrangements may e employed. More particularly, the transit time frequency may be in the C-band and the high frequency applied to the load may be in the X-band but the high frequency may remain in the X-band, or the transit-time frequency applied to the load may be in the Ka-band. In any case, the waveguide which supports the high frequency applied to the load has a cutoff frequency above the transit-time frequency.

What we claim:

1. In combination, an anomalous avalanche diode capable when biased of deriving anomolous mode oscillations characterized by the occurrence of a significant decrease in average voltage observed across the diode during oscillation at its peak power output, the occurrence of a threshold current-density at said peak power output of at least 2,000 amperes per square centimeter, and the requirement that both relatively high frequency tuning and low frequency tuning are critical to achieve said peak power output at a certain frequency significantly above the transit-time mode oscillation frequency of said diode; and a wave tuning structure including a first portion in cooperative relationship with said diode, a tunable second portion coupled to said first portion for supporting oscillations at said transit-time frequency of said diode, and a tunable third portion coupled to at least one of said first and second portions for supporting oscillations at said certain frequency in response to both said second and third portions having said critical tuning, whereby in response to a power consuming load being coupled to said third portion and a bias level of a certain value of at least 2,000 amperes per square centimeter being applied to said diode peak power output oscillations of a high value are developed at said certain frequency and applied to said load.

2. The combination defined in claim 1, wherein said transit-time frequency is no higher than the X-band and said certain frequency is above the X-band.

3. The combination defined in claim 2, wherein said certain frequency is at least 20 gigaHertz.

4. The combination defined in claim 1, wherein said second portion includes a length of first waveguide section dimensioned to be capable of transporting energy at said transit time frequency and short circuiting means for short circuiting one end of said first waveguide section, wherein said third portion includes a length of second waveguide section dimensioned to be capable of transporting energy at said certain frequency but not at said transit time frequency, said structure further including a tapered waveguide section for coupling the other end of said first waveguide section to one end of said second waveguide section, the other end of said second waveguide section being adapted to be coupled to an external power-consuming load; and wherein said first portion includes a cavity in which said diode is located and said structure further includes means communicating between said cavity and said first waveguide section for coupling electromagnetic energy therebetween.

5. The combination defined in claim 4, wherein said short circuiting means are longitudinally movable to thereby render said first waveguide section tunable over a frequency range including said transit time frequency, and wherein said structure further includes an E–H tuner in cooperative relationship with said second waveguide section for effecting matching between said first waveguide section, said second waveguide section and an external load to thereby permit the output power at said certain frequency applied to said load to be maximized.

6. The combination defined in claim 1, wherein said third portion comprises a waveguide section terminated at one end thereof in a short circuit and terminated at one end thereof in a short circuit and terminated at the other end thereof in a power consuming load, wherein said second portion comprises a coaxial section capacitively coupled through a T-junction to said waveguide section at a point thereof intermediate the ends thereof, wherein said first portion comprises a cavity coupled to said waveguide section and located in substantially colinear relationship with said T-junction on the opposite side of said waveguide section from said coaxial section, and means including the center conductor of said coaxial section passing through said T-junction and waveguide section to said cavity for applying said bias level to said diode.

7. The combination defined in claim 6, wherein said short-circuited end of said waveguide section is movable with respect to said point, and wherein said structure further includes an E–H tuner in cooperative relationship with said waveguide section intermediate said point and said other end thereof for effecting matching of said load and said structure.

8. The combination defined in claim 6, wherein said structure further includes a transit time tuning means coupled to the distal end of said coaxial section, wherein said coaxial section includes a DC blocking capacitance coupling a first portion of the center conductor thereof which center conductor first portion is coupled to said tuning means to a second portion of the center conductor thereof which center conductor second portion is connected to said second portion of said center conductor for applying said bias level to said diode.

9. The combination defined in claim 1, wherein said third portion comprises a first waveguide section terminated at one end thereof in a short circuit and terminated at the other end thereof in a power consuming load, said first waveguide section being dimensioned to support oscillations at said certain frequency but not at said transit time frequency, a second waveguide section oriented substantially perpendicular to said first waveguide section and intersecting and crossing said first waveguide section intermediate the ends thereof to define therewith a common central interior region, one end of said second waveguide section being terminated by a short circuit and the other end thereof being terminated by tuning means, said second waveguide section being dimensioned to support said transit time frequency, and wherein said first portion and said diode are located outside of but adjacent to said central region and extend in a direction substantially perpendicular to a plane defined by said first and second waveguide sections, and means communicating between said first portion and said interior region to provide coupling therebetween.

10. The combination defined in claim 9, wherein said respective short circuited ends of said first and second waveguide sections are movable and wherein said structure further includes an E–H tuner in cooperative relationship with said first waveguide section intermediate said central region and said other end thereof for effecting matching of said load and said structure.

11. The combination defined in claim 1, wherein said avalanche diode is a silicon diode.

UNITED STATES PATENT OFFICE
CERTIFICATE OF CORRECTION

Patent No. 3,593,193 Dated July 13, 1971

Inventor(s) Kern Ko-Nan Chang and Shing-Gong Liu & John Joseph Risko

It is certified that error appears in the above-identified patent and that said Letters Patent are hereby corrected as shown below:

Column 3, line 27 "Fig.," should be --Figure 1--

Column 3, line 71 after "may" "e" should be --be--

Column 3, line 73 "X band but the high frequency may remain in the X-band, or the transit time frequency applied to the lad may be in the Ka band." should be --X band, or the transit time frequency may remain in the X band, but the high frequency applied to the load may be in the Ka-band.--

Column 4, lines 64 and 65 cancel "and terminated at one end thereof in a short circuit"

Column 5, line 14 after "said" (first occurrence) insert --diode and further includes inductance means connected to said--

Signed and sealed this 23rd day of May 19[illegible]

(SEAL)
Attest:

EDWARD M.FLETCHER, JR.
Attesting Officer

ROBERT GOTTSCHALK
Commissioner of Patents